US012386228B2

(12) United States Patent
Matsushima

(10) Patent No.: US 12,386,228 B2
(45) Date of Patent: Aug. 12, 2025

(54) DISPLAY DEVICE

(71) Applicant: Magnolia White Corporation, Tokyo (JP)

(72) Inventor: Toshiharu Matsushima, Tokyo (JP)

(73) Assignee: MAGNOLIA WHITE CORPORATION, Tokyo (JP)

(*) Notice: Subject to any disclaimer, the term of this patent is extended or adjusted under 35 U.S.C. 154(b) by 43 days.

(21) Appl. No.: 18/184,012

(22) Filed: Mar. 15, 2023

(65) Prior Publication Data

US 2023/0296946 A1    Sep. 21, 2023

(30) Foreign Application Priority Data

Mar. 15, 2022    (JP) ................................. 2022-040574

(51) Int. Cl.
| | |
|---|---|
| *G02F 1/1362* | (2006.01) |
| *G02F 1/1343* | (2006.01) |
| *H10D 86/40* | (2025.01) |
| *H10D 86/60* | (2025.01) |

(52) U.S. Cl.
CPC .. *G02F 1/136231* (2021.01); *G02F 1/134309* (2013.01); *G02F 1/134363* (2013.01); *G02F 1/136213* (2013.01); *G02F 1/136286* (2013.01); *H10D 86/441* (2025.01); *H10D 86/60* (2025.01); *G02F 2201/121* (2013.01); *G02F 2201/123* (2013.01)

(58) Field of Classification Search
CPC ......... G02F 1/136231; G02F 1/134309; G02F 1/134363; G02F 1/136213; G02F 1/136286; G02F 2201/121; G02F 2201/123; H01L 27/124
See application file for complete search history.

(56) References Cited

U.S. PATENT DOCUMENTS

| | | | | |
|---|---|---|---|---|
| 6,072,554 | A * | 6/2000 | Sato | ................. G02F 1/134363 349/158 |
| 2002/0008796 | A1* | 1/2002 | Kung | ................. G02F 1/13318 349/42 |
| 2002/0131005 | A1* | 9/2002 | Yang | ................. G02F 1/134363 349/141 |
| 2002/0131006 | A1* | 9/2002 | Yang | ................. G02F 1/134363 349/141 |
| 2018/0203306 | A1 | 7/2018 | Matsushima | |
| 2019/0146255 | A1* | 5/2019 | Matsushima | ..... G02F 1/134363 349/12 |

FOREIGN PATENT DOCUMENTS

JP    2018-116184 A    7/2018

\* cited by examiner

*Primary Examiner* — James A Dudek
(74) *Attorney, Agent, or Firm* — XSENSUS LLP

(57) ABSTRACT

According to one embodiment, a display device includes a plurality of scanning lines, a plurality of signal lines, a plurality of pixels, a pixel electrode and a common electrode, wherein the pixel electrode includes a first trunk portion and a plurality of first branch portions extending from the first trunk portion, the common electrode includes a second trunk portion and a plurality of second branch portions extending from the second trunk portion, the plurality of first branch portions and the plurality of second branch portions are arranged alternately, and the signal lines and the pixel electrodes are formed of a same material and by a same process.

6 Claims, 14 Drawing Sheets

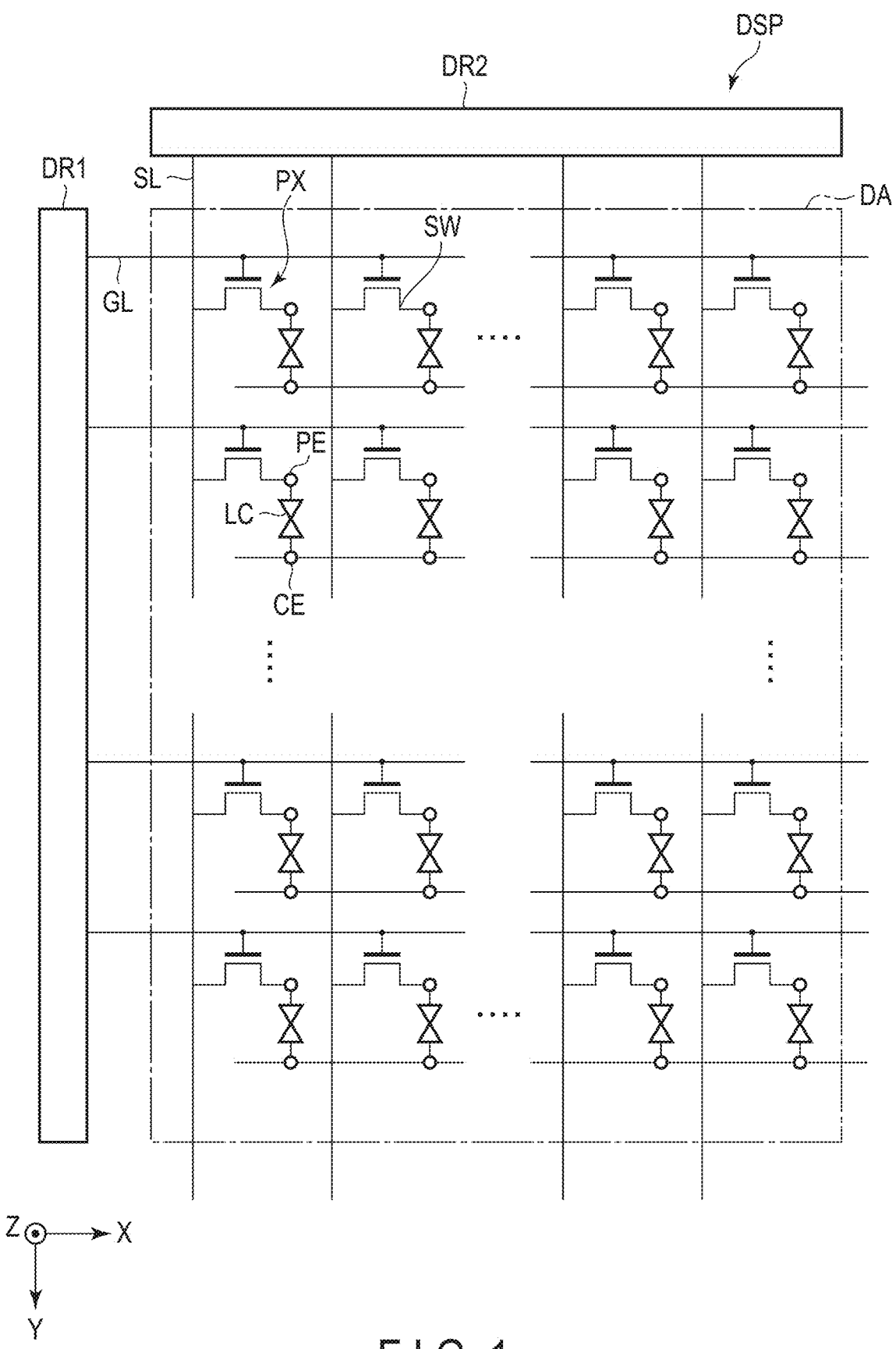
F I G. 1

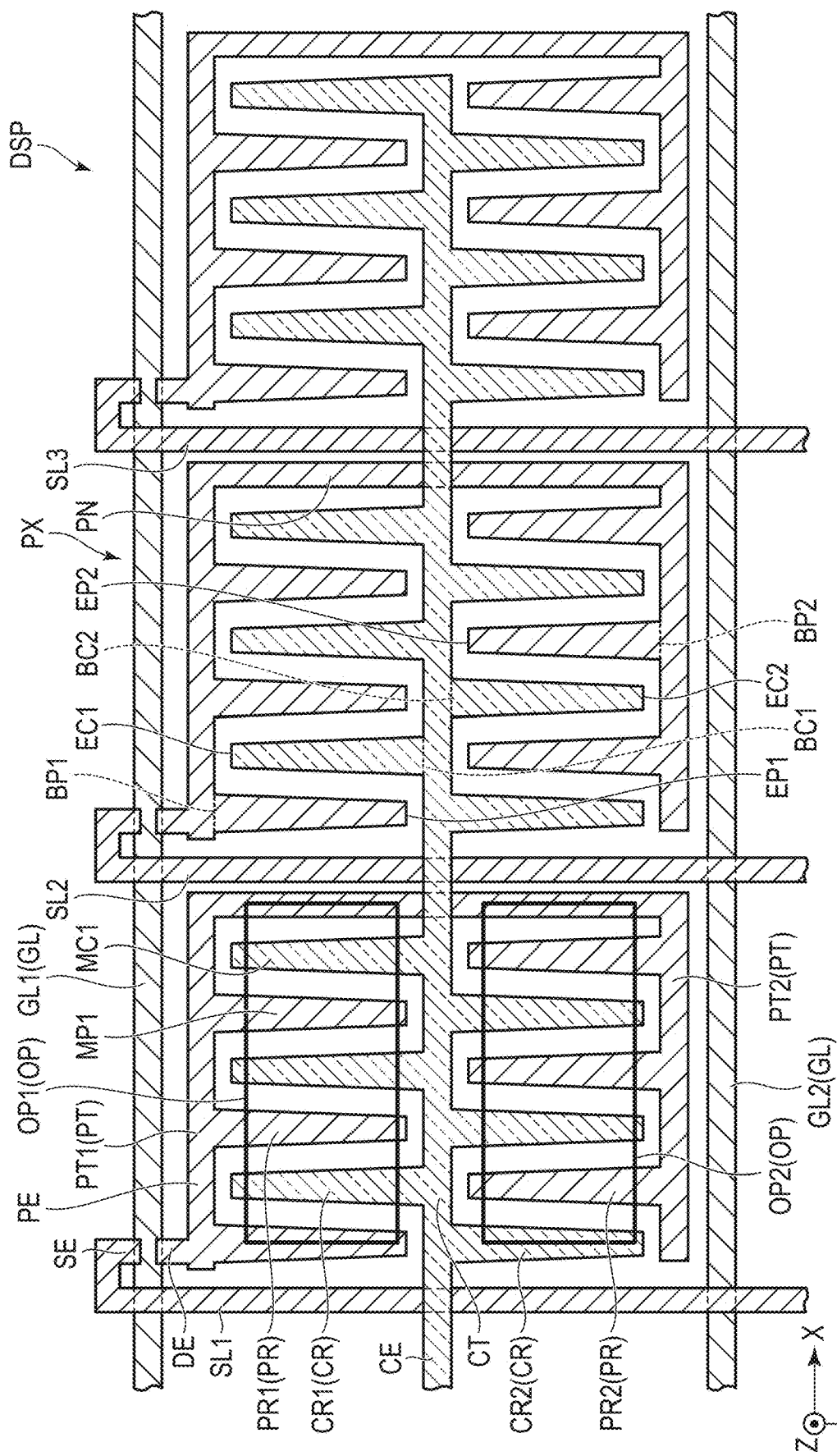
F I G. 5

DISPLAY DEVICE

CROSS-REFERENCE TO RELATED APPLICATIONS

This application is based upon and claims the benefit of priority from Japanese Patent Application No. 2022-040574, filed Mar. 15, 2022, the entire contents of which are incorporated herein by reference.

FIELD

Embodiments described herein relate generally to a display device.

BACKGROUND

As One example of display devices is a liquid crystal display device of an in-plane-switching (IPS) display. In in-plane-switching (IPS)-mode liquid crystal displays, a pixel electrode and a common electrode are provided on one of a pair of substrates opposing each other via a liquid crystal layer, and the alignment of liquid crystal molecules in the liquid crystal layer is controlled using a horizontal electric field generated between these electrodes. Further, among the IPS-mode devices, fringe field switching (FFS)-mode liquid crystal devices, in which a pixel electrode and a common electrode are placed on different layers respectively have been put to practical use. In such liquid crystal devices, the alignment of liquid crystal molecules is controlled by using a fringe electric field generated between a pair of electrodes.

On the other hand, such a liquid crystal display device is known that the response speed is accelerated by periodically forming a region where the liquid crystal molecules do not rotate in each pixel. The configuration of liquid crystal displays of this type is hereinafter referred to as a high-speed response mode.

BRIEF DESCRIPTION OF THE DRAWINGS

FIG. 1 is a diagram showing an example of an equivalent circuit of a display device.

FIG. 5 is a plan view schematically showing an example of the configuration of the display device of the embodiment.

DETAILED DESCRIPTION

Figure 2:
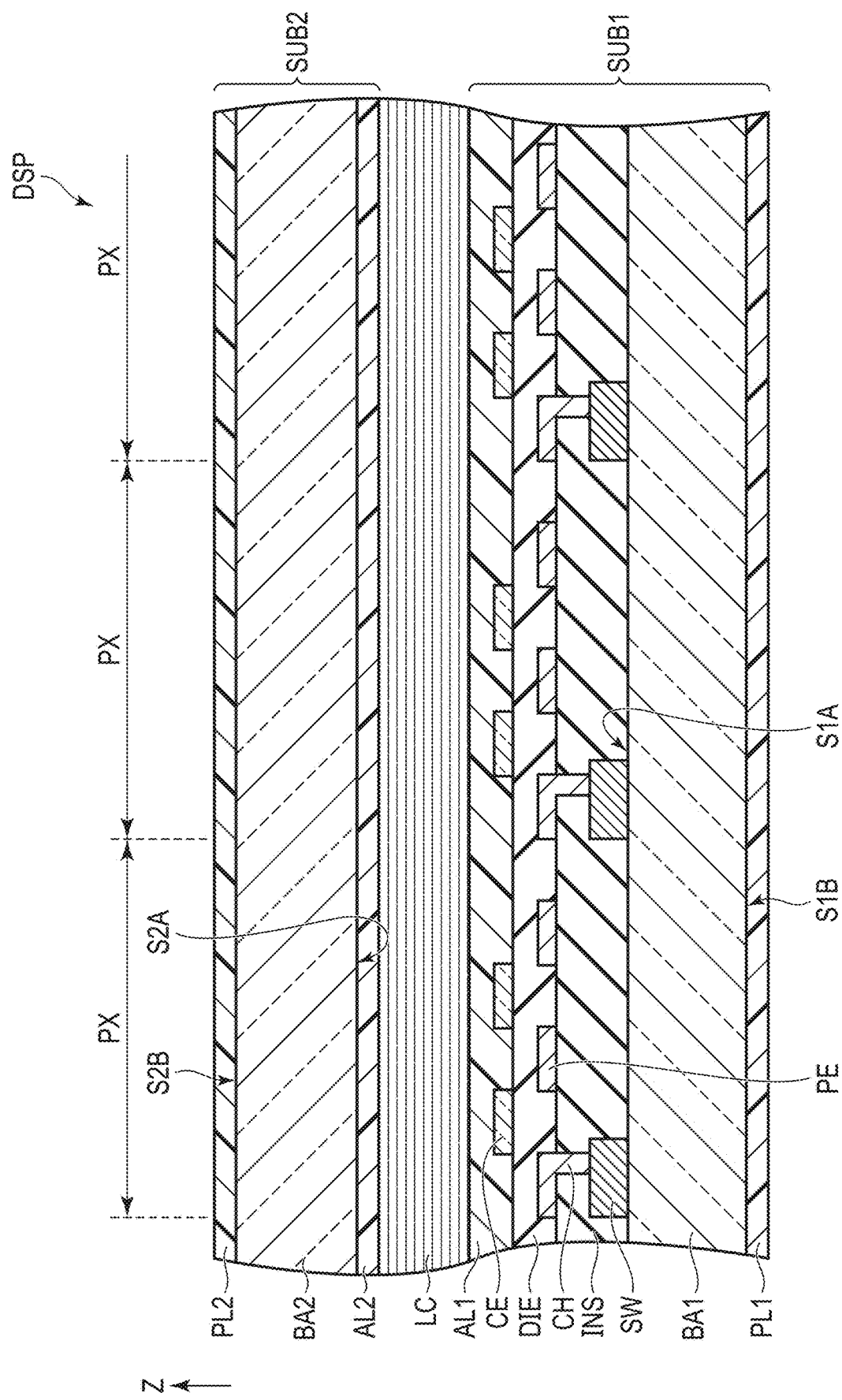
FIG. 2 is a cross-sectional view showing an example of the configuration of the display device.

In general, according to one embodiment, a display device comprising: a plurality of scanning lines extending along a first direction; a plurality of signal lines extending along a second direction intersecting the first direction; a plurality of pixels provided at respective intersections of the plurality of scanning lines and the plurality of signal lines; a pixel electrode provided in each of the plurality of pixels and formed in a same layer as that of the signal lines; and a common electrode provided over the plurality of pixels, wherein the pixel electrode incudes a first trunk portion and a plurality of first branch portions extending from the first trunk portion, the common electrode includes a second trunk portion and a plurality of second branch portions extending from the second trunk portion, the plurality of first branch portions and the plurality of second branch portions are arranged alternately in line with each other, and the signal lines and the pixel electrodes are formed of a same material and by a same process.

An object of this embodiment is to provide a display device in which the number of manufacturing steps is reduced and the reliability is improved.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

The embodiments described herein are not general, but rather embodiments that describe the same or corresponding special technical features of the invention. The following is a detailed description according to one embodiment of a display device with reference to the accompanying drawings.

In this embodiment, a first direction X, a second direction Y and a third direction Z are orthogonal to each other, but may intersect at an angle other than 90 degrees. The direction toward the tip of the arrow in the third direction Z is defined as up or above, and the direction opposite to the direction toward the tip of the arrow in the third direction Z is defined as down or below. Note that the first direction X, the second direction Y and the third direction Z may as well be referred to as an X direction, a Y direction and a Z direction, respectively.

With such expressions as "a second member above a first member" and "the second member below the first member", the second member may be in contact with the first member or may be separated from the first member. In the latter case, a third member may be interposed between the first member and the second member. On the other hand, with such expressions "the second member on the first member" and "the first member on the second member" the second member is in contact with the first member.

When it is assumed that there is an observation position to observe the display device on the tip side of the arrow in the third direction Z, viewing from this observation position toward the X-Y plane defined by the first direction X and the second direction Y is referred to as plan view. Viewing the cross-section of the display device in the X-Z plane defined by the first direction X and the third direction Z or in the Y-Z plane defined by the second direction Y and the third direction Z is referred to as cross-sectional view.

Embodiment

FIG. 1 is a diagram showing an example of an equivalent circuit of a display device.

A display device DSP comprises a plurality of pixels PX, a plurality of scanning lines GL, and a plurality of signal lines SL in a display area DA which displays images. The scanning lines GL and the signal lines SL cross each other. Further, the display device DSP comprises a driver DR1 and a driver DR2 on an outer side of the display area DA. The scanning lines GL are electrically connected to the driver DR1. The signal lines SL are electrically connected to the driver DR2. The driver DR1 and the driver DR2 are controlled by a controller.

The pixels PX shown here are referred to as sub-pixels or color pixels, and correspond to, for example, red pixels which display red, green pixels which display green, blue pixels which display blue, or white pixels which display white, respectively. The pixels PX are located at respective intersections of the scanning lines GL and the signal lines SL. Further, the pixels PX are each compartmentalized by two scanning lines GL and two signal lines SL.

Each pixel comprises a switching element SW, a pixel electrode PE and a common electrode CE opposing the pixel electrode PE. The switching element SW is electrically connected to the respective scanning line GL and the respective signal line SL. The pixel electrode PE is electrically connected to the switching element SW. In other words, the pixel electrode PE is electrically connected to the signal line SL via the switching element SW. The common electrode CE is formed over a plurality of pixels PX. A common potential is applied to the common electrode CE.

The driver DR1 supplies scanning signals to the respective scanning lines GL. The driver DR2 supplies video signals to the respective signal lines SL. In the switching element SW electrically connected to the scanning line GL to which the scanning signal is supplied, the signal line SL and the pixel electrode PE are electrically connected, and the voltage corresponding to the video signal supplied to the signal line SL is applied to the pixel electrode PE. The liquid crystal layer LC is driven by an electric field generated between the pixel electrode PE and the common electrode CE. In more detail, with the electric field generated between the pixel electrode PE and the common electrode CE, the alignment of the liquid crystal molecules in the liquid crystal layer LC is changed from the initial alignment state where no voltage is applied. Through this operation, images are displayed on the display area DA.

FIG. 2 is a cross-sectional view showing an example of the configuration of the display device.

The display device DSP comprises a substrate SUB1, a substrate SUB2 and a liquid crystal layer LC held between the substrate SUB1 and the substrate SUB2.

The substrate SUB1 comprises a base BA1, an insulating layer INS, an insulating layer DIE and an alignment film AL1, in addition to the switching element SW, the pixel electrode PE, the common electrode CE and the like. The substrate SUB1 comprises the scanning lines GL, the signal lines SL, the driver DR1, the driver DR2 and the like shown in FIG. 1 as well. The base BA1 is formed from a optically transparent glass base, resin base or the like. The base BA1 including a main surface S1A opposing the substrate SUB2 and a main surface S1B on an opposite side to the main surface S1A.

The switching element SW is formed on a side of the main surface S1A of the base BA1 and is covered by the insulating layer INS. In the example illustrated in FIG. 2, the switching element SW is shown in simplified form for convenience of explanation of the embodiment, and the scanning lines GL and signal lines SL are omitted from illustration. In practice, the insulating layer INS may include multiple insulating layers. The switching element SW includes a semiconductor layer and various electrodes, formed on these layers.

The pixel electrodes PE are formed on the insulating layer INS and are each disposed in each of the pixels PX. The pixel electrodes PE are covered by the insulating layer DIE. The common electrodes CE are provided in a predetermined shape for each pixel PX and multiple pixels PX are connected across by this shape. The common electrodes CE are formed on the insulating layer DIE and oppose the respective pixel electrodes PE via the insulating layer DIE. Details of the shapes of the pixel electrodes PE and the common electrodes CE will be described later.

The pixel electrodes PE are each electrically connected to the respective switching element SW via a contact hole CH that penetrates the insulating layer INS. The pixel electrodes PE and the common electrodes CE are transparent electrodes formed of, for example, transparent conductive materials such as indium tin oxide (ITO) and indium zinc oxide (IZO).

The alignment film AL1 covers the common electrodes and is in contact with the liquid crystal layer LC. The alignment film AL1 is, for example, a photo-alignment film that has been subjected to a photo-alignment treatment, for example.

The substrate SUB2 comprises a base BA2 and an alignment film AL2. The base BA2 is formed from a optically transparent glass substrate, a resin substrate, or the like. The base BA2 has a main surface S2A facing the substrate SUB1 and a main surface S2B opposite the main surface S2A.

The alignment film AL2 is provided in contact with the base BA2 and is in contact with the liquid crystal layer LC. The alignment film AL2 is a photo-alignment film that has been subjected to the photo-alignment treatment as in the case of the alignment film AL2.

Between the alignment film AL2 and the base BA2, an insulating layer, a color filter between adjacent switching elements SW, a light-shielding layer opposing the respective switching element SW and the like may be provided.

A polarizer PL1 is adhered to the main surface S1B of the base BA1, and a polarizer PL2 is adhered to the main surface S2B of the base BA2.

Figure 3:
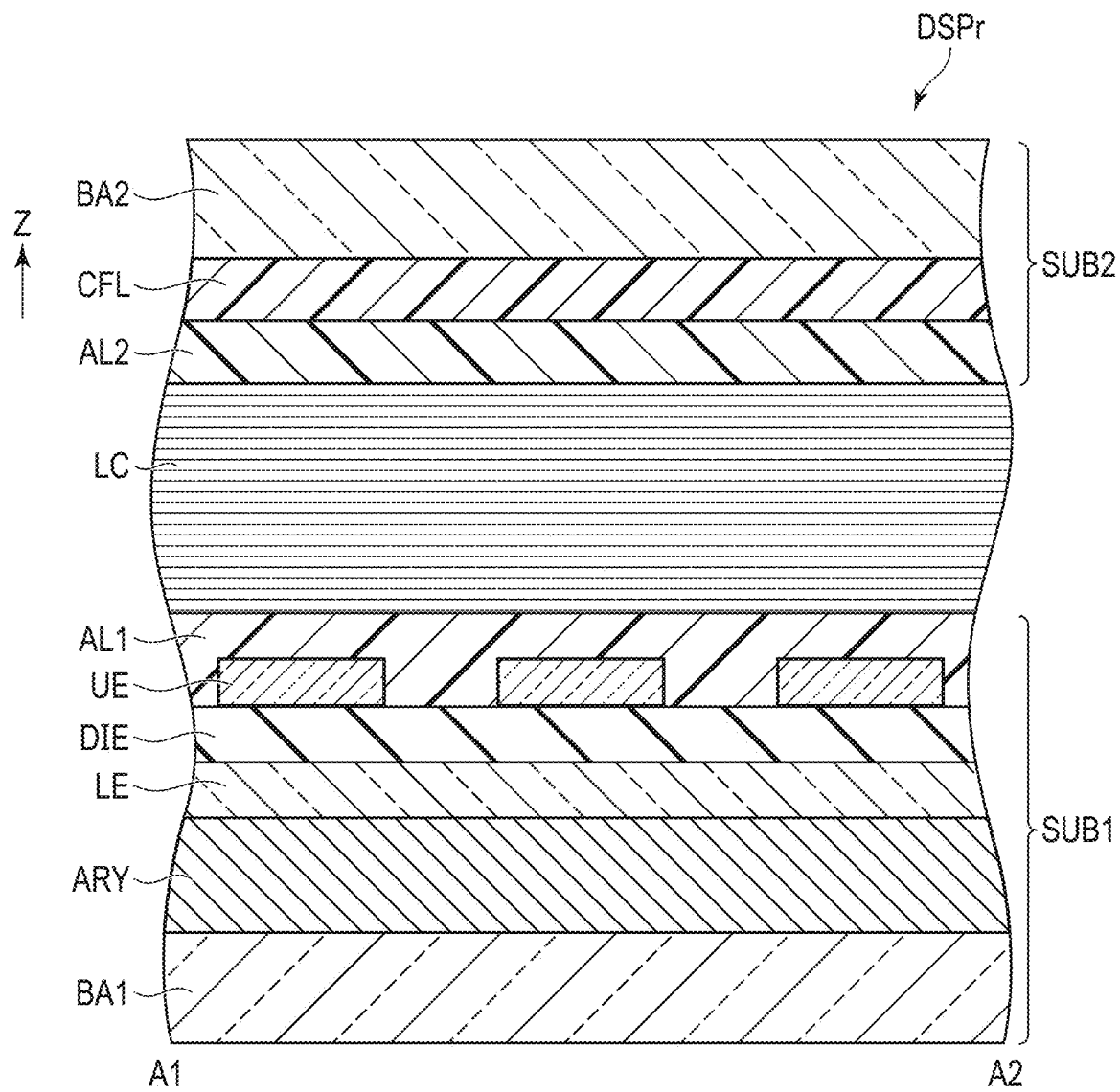
FIG. 3 is a cross-sectional view showing a configuration of a display device of a comparative example.

FIG. 3 is a cross-sectional view of a configuration of a display device in a comparative example. A display device DSP shown in FIG. 3 has such a structure that a liquid crystal layer LC is sandwiched between the substrate SUB1 and the substrate SUB2. In the substrate SUB1, an array structure layer ARY is provided on the base BA1. The array structure layer ARY includes, for example, the switching elements and the like described above.

On the array structural layer ARY, a lower electrode LE is provided, which is electrically connected to the elements included in the array structural layer ARY. The lower electrode LE is provided over the entire array structure layer ARY.

On the lower electrode LE, an insulating layer DIE is provided. On the insulating layer DIE, a plurality of island-shaped upper electrodes UE are provided. The upper electrodes UE are provided respectively for the pixels of the array structure layer ARY, for example. The upper electrodes UE oppose the lower electrodes LE, respectively, via the insulating layer DIE.

The alignment film AL1 is provided to cover the lower electrodes LE.

On the substrate SUB2, a color filter layer CFL is provided in contact with the base BA2. The alignment film AL2 is provided in contact with the color filter layer CFL.

Between the substrate SUB1 and the substrate SUB2, that is, between the alignment film AL1 and the alignment film AL2, the liquid crystal layer LC is provided.

Figure 4:
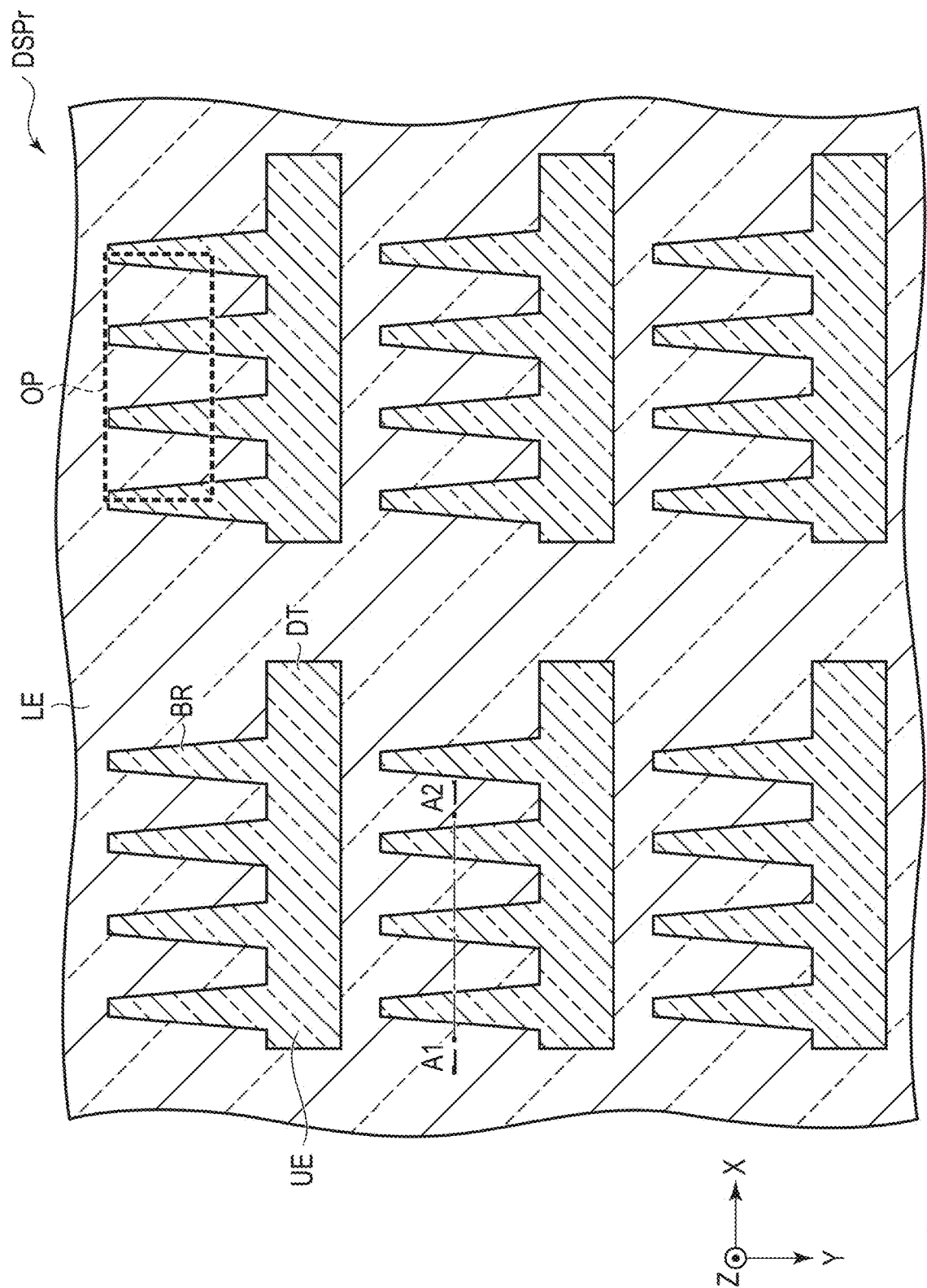
FIG. 4 is a plan view showing of the configuration of the display device of the comparative example.

FIG. 4 is a plan view showing a configuration of a display device of a comparative example. In FIG. 4, only the upper electrode UE and the lower electrode LE are shown to make the explanation easily understandable. Note here that FIG. 3 is a cross-sectional view of the display device DSPr taken along line A1-A2 shown in FIG. 4.

The lower electrode LE is provided over multiple pixels, as described above, and is formed by a so-called solid film. The upper electrodes UE each include a trunk portion DT extending along the first direction X and a plurality of branch portions BR extending from the trunk portion DT along a direction parallel to the second direction Y.

The region where the branch portions BR are provided is covered by an aperture OP and a light-shielding layer surrounding the aperture OP. The light-shielding layer shades regions where the liquid crystal molecules do not move and regions with different transmittances.

As shown in FIGS. 3 and 4, the upper electrodes UE and the lower electrodes LE are formed respectively in layers different from that of the array structure layer ARY. With this configuration, the upper electrodes UE and lower electrodes LE, as well as the wiring lines and electrodes included in the array structure layer ARY are formed in processing steps different from each other.

To form the wiring lines and electrodes, the following processing steps are required: depositing a material film; forming a resist mask using a photomask, removing unnecessary portions of the material film by etching; and removing the resist mask. As the number of electrodes and wiring layers increases, the number of these processing steps increases. As a result, the manufacturing cost may undesirably increase.

Further, if the number of the above-described processing steps increases, for example, the resist mask may not be completely removed in the step of removing the resist mask, and a part thereof may remain on the electrodes and wiring lines. If a part of the resist mask remains between the electrodes, it may cause a short circuit, thereby deteriorating the reliability of the display device. Therefore, it is preferable that the number of such processing steps is less.

FIG. 5 is a plan view schematically showing an example of the configuration of the display device of the embodiment. Each of the pixels PX contained in the display device DSP comprises a scanning line GL1 and a scanning line GL2 extending along the first direction X, and signal lines SL (a signal line SL1, a signal line SL2 and a signal line SL3 from the left of the page) extending along the second direction Y.

A part of each signal line SL protrudes along the first direction X and the second direction Y so as to constitute a source electrode SE. Opposing the source electrode SE, a drain electrode DE is formed. The drain electrode DE is formed to be integrated with the respective pixel electrode PE and is provided in the same layer as that of the source electrode SE.

Note that in this embodiment, wiring lines and the like formed by the same material and the same processing step are referred to as wiring lines and the like provided in the same layer.

The pixel electrode PE includes a trunk portion PT1 and a trunk portion PT2 extending along the first direction X, a plurality of branch portions PR1 extending from the trunk portion PT1 along the second direction Y, and a plurality of branch portions PR2 extending from the trunk portion PT2 along a direction opposite to the second direction Y. When it is not necessary to distinguish between the trunk portions PT1 and the trunk portion PT2, they are referred to as trunk portions PT. When it is not necessary to distinguish between the branch portions PR1 and the branch portions PR2, they are referred to as branch portions PR. The branch portion PR1 and the branch portion PR2 farthest from the signal line SL are connected to each other to constitute a connection wiring line PN. The connection wiring line PN connects the trunk portions PT1 and the trunk portions PT2.

Between the signal line SL1 and the signal line SL2, the trunk portion CT of the common electrode CE extends along the first direction X. A plurality of branch portions CR1 extend from the trunk portion CT along a direction opposite to the second direction Y. A plurality of branch portions CR2 extend from the trunk portion CT along the second direction Y. The branch portions CR1 and the branch portions PR1 are arranged alternately in line with each other along the first direction X. The branch portions CR2 and the branch portions PR2 are arranged alternately in line with each other along the first direction X. If it is not necessary to distinguish between the branch portions CR1 and the branch portions CR2, they are referred to as branch portions CR.

In other words, the trunk portions PT and the trunk portions CT are arranged parallel to each other. The branch portions PR and the branch portions CR are arranged parallel to each other. The trunk portion PT and the trunk portion CT intersect in their extension directions, and so do the branch portions PR and the branch portions CR.

The branch portion PR1 includes a distal end, which is referred to as an end portion (edge) EP1, and the boundary between the trunk portion PT1 and the branch portions PR1 is referred to as a base portion BP1. The branch portions PR2 includes a distal end, which is referred to as an end portion (edge) EP2, and the boundary between the trunk portion PT2 and the branch portion PR2 is referred to as a base portion BP2. The branch portion CR1 includes a distal end, which is referred to as an end portion (edge) EC1, and the boundary between the trunk portion CT and the branch portion CR1 is referred to as a base portion BC1. The branch portion CR2 includes a distal end portion, which is referred to as an end portion (edge) EC2, and the boundary between the trunk portion CT and branch the portions CR2 is referred to as a base portion BC2.

If there is no need to particularly distinguish between the end portions EP1 and the end portions EP2, they are referred to as end portions EP. If there is no need to particularly distinguish between the end portions EC1 and the end portions EC2, they are referred to as end portions EC. If there is no need to particularly distinguish between the base portions BP1 and the base portions BP2, they are referred to as base portions BP. If there is no need to particularly distinguish between the base portions BC1 and the base portions BC2, they are referred to as base portions BC.

The branch portions PR and the branch portions CR each have a tapered shape narrowing towards the distal end. If the dimension in the intersecting direction with respect to the extending direction is defined as width, the width at the distal end of each of the branch portions PR and the branch portions CR is narrower than the width at the base portion thereof. The width of each of the branch portions PR and the branch portions CR becomes less as it extends further.

A light-shielding layer is provided between the signal line SL and the adjacent signal line SL, and in the region surrounded by the scanning line GL1 and the trunk portion CT except for the aperture OP1. A light-shielding layer is provided between the signal line SL and the adjacent signal line SL, and in the region surrounded by the scanning line GL2 and the trunk portion CT except for the aperture OP2. The regions covered by the light-shielding layers do not transmit light. The region of the outer side of the solid lines indicating the aperture OP1 and the aperture OP2 in the figure is surrounded by the light-shielding layer, and only the region of the inner side of the solid lines indicating the aperture OP1 and the aperture OP2 transmits light. When there is no need to distinguish between the aperture OP1 and the aperture OP2, they are referred to as apertures OP.

The aperture OP1 overlaps a region MP1 of the branch portion PR1, which excludes the region near the end portion EP1 and the region near the base portion BP1, and a region MC1 of the branch portion CR1, which excludes the region near the end portion EC1 and the region near the base portion BC1.

The aperture OP2 overlaps a region MP2 of the branch portion PR2, which excludes the region near the end portion EP2 and the region near the base portion BP2, and a region MC2 of the branch portion CR2, which excludes the region near the end portion EC2 and the region near the base portion BC2.

The end portion EP1 of the branch portion PR1, the end portion EP2 of the branch portion PR2, the end portion EC1 of the branch portion CR1, and the end portion EC2 of the branch portion CR2 are covered by the light-shielding layers. A part of the branch portion BR closest to the signal line SL and a part of the connection wiring line PN as well are covered by the light-shielding layer. In the regions around the end portion EC1, the end portion EC2, the end portion EP1 and the end portion EP2, the alignment of the liquid crystal molecules may not be stable, and therefore it is preferable to shield the light. The details of the alignment of the liquid crystal molecules will be described later.

In the configuration shown in FIG. 5, the pixel electrode PE and the drain electrode DE are formed to be integrated as one body in the same layer as that of the signal lines SL. In other words, the signal lines SL, the drain electrodes DE, and the pixel electrodes PE can be formed with a single photomask. Thus, by executing a series of processing steps using the above-described photomask once, the signal lines SL, the drain electrode DE and the pixel electrodes PE can be formed. In this manner, as compared to the case where the signal lines SL, drain electrodes DE and pixel electrodes PE are formed in separate processing steps, the number of processing steps which use a photomask can be reduced. As a result, advantageous effects of reduction in the number of manufacturing steps and the improvement in reliability can be obtained.

Figure 6:
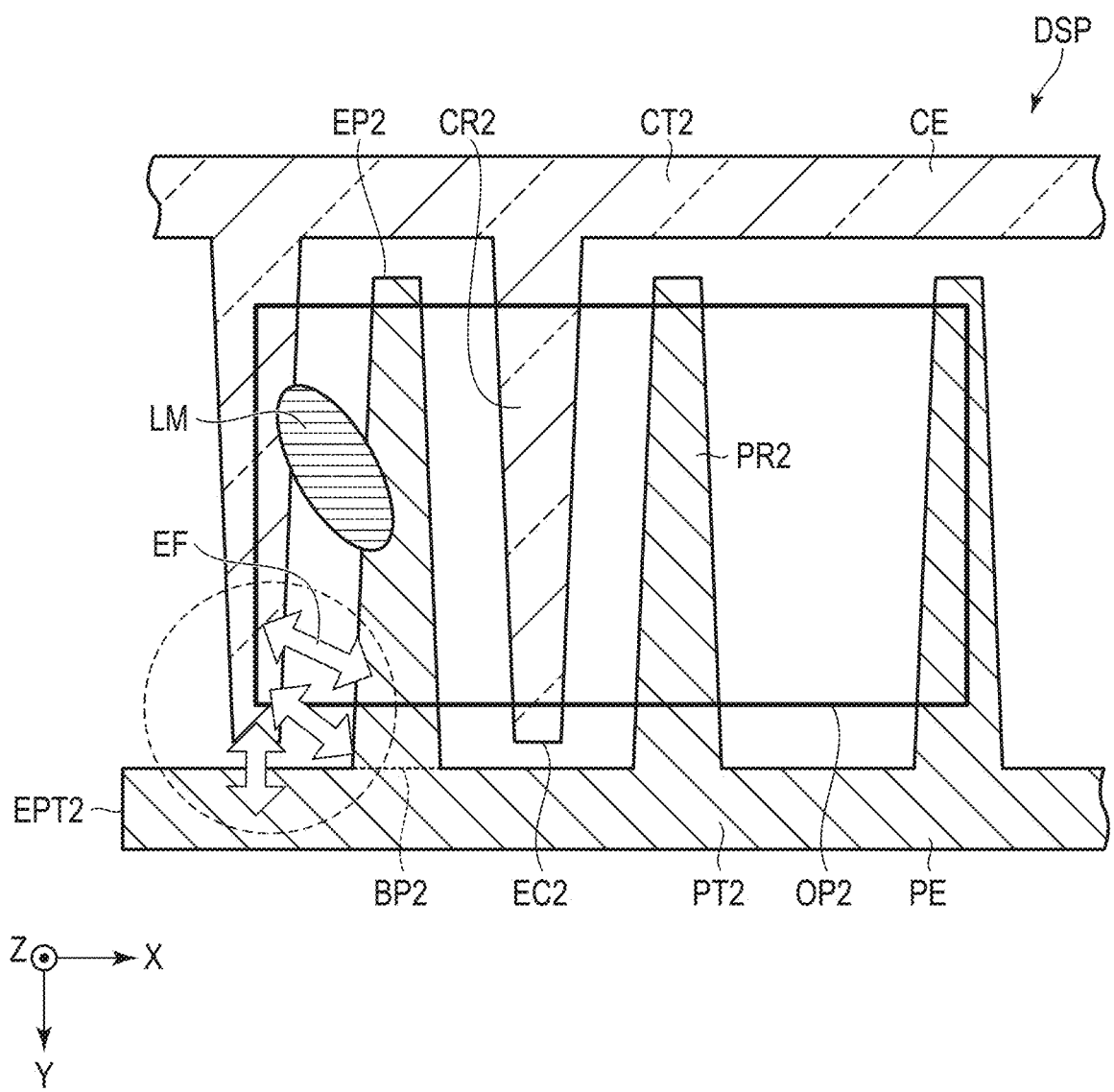
FIG. 6 is a plan view schematically showing an example of the configuration of the display device of the embodiment.

FIG. 6 is a plan view schematically showing an example of the configuration of the display device of the embodiment. In FIG. 6, parts of the pixel electrodes PE and the common electrodes CE, which are located around the aperture OP2, are shown.

Around the end portion EC2 of the branch portion CR2, as well as between around the base portions BP2 of the adjacent branch portions PR2 along the first direction X and the end portion EP2 of the trunk portion PT2, an electric field EF, indicated by arrows, are generated. The electric field EF determines the alignment direction of the liquid crystal molecules LM when voltage is applied.

In FIG. 6, the direction of the electric field EF (the direction in which lines of electric force are generated) rotates clockwise as approaching the end portion EC2 of the branch portion CR2. The alignment of the liquid crystal molecules LM is stabilized when the direction of the rotation follows the arc of the virtual circle.

In FIG. 6, the end portion EPT2 of the trunk portion PT2 extends beyond the oblique side of the branch portions PR2 and along a direction opposite to the first direction X. The case where the end portion EPT2 of the trunk portion PT2 coincides with the oblique side of the branch portion PR2 will be described with reference to FIG. 7.

Figure 7:
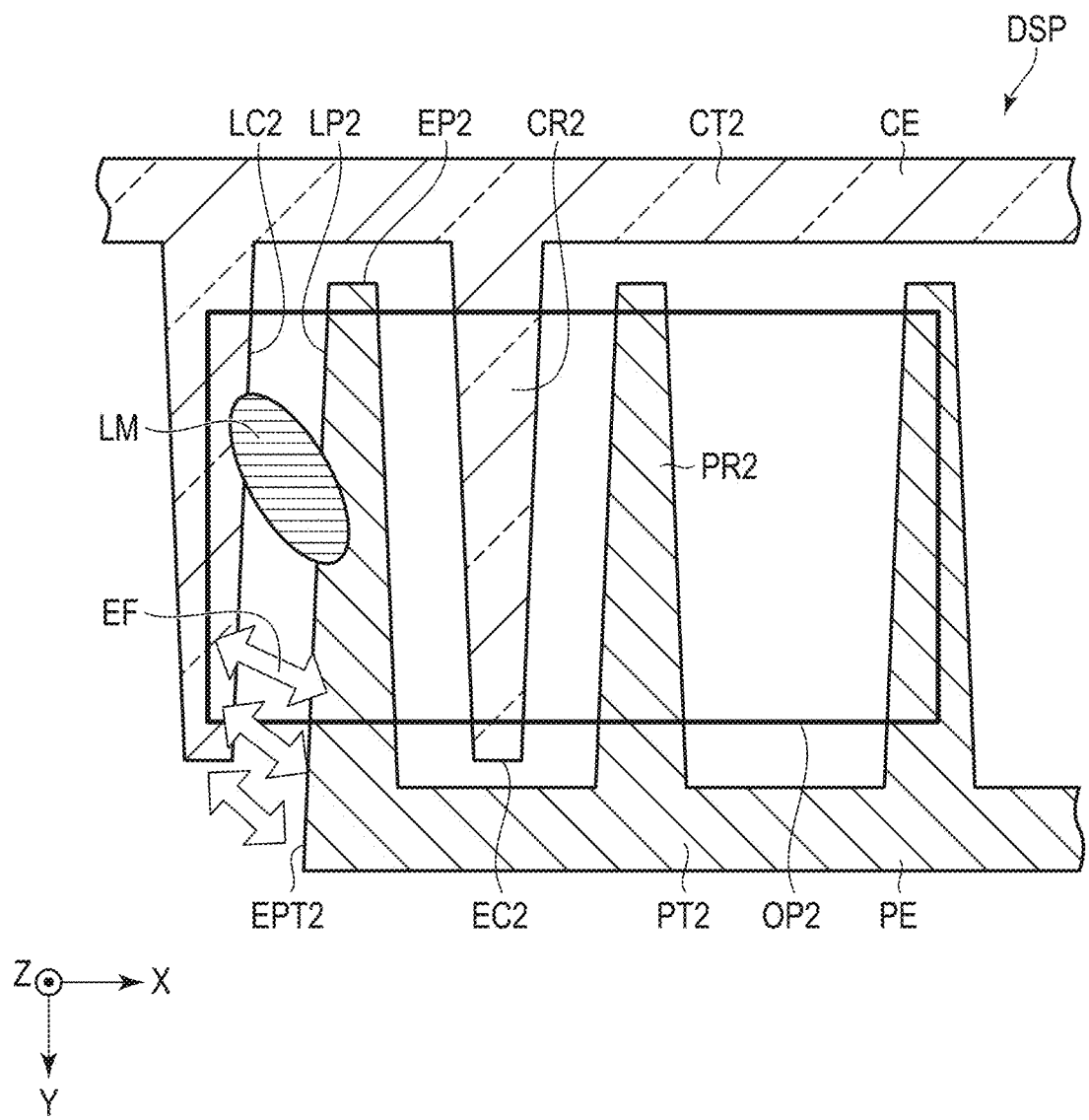
FIG. 7 is a plan view schematically showing an example of the configuration of the display device of the embodiment.

FIG. 7 is a plan view schematically showing an example of the configuration of the display device of the embodiment. As described above, the end portion EPT2 of the trunk portion PT2 coincides with the oblique side LP2 of the branch portion PR2. In this case, the direction of the electric field EF does not follow the virtual circle and does not rotate. Further, the distance between the end portion EC2 of the branch portion CR2 and the end portion EPT2 (the oblique side LP2) is greater than the other part, for example, the distance between the oblique side LC2 of the branch portion CR2 and the oblique side LP2 of the branch portion PR2. The electric field EF generated between the end portion EC2 and the end portion EPT2 may undesirably be weaker than that in the other part. From the above, the stability of the alignment of the liquid crystal molecules LM shown in FIG. 7 may undesirably be lower than that of FIG. 6.

Figure 8:
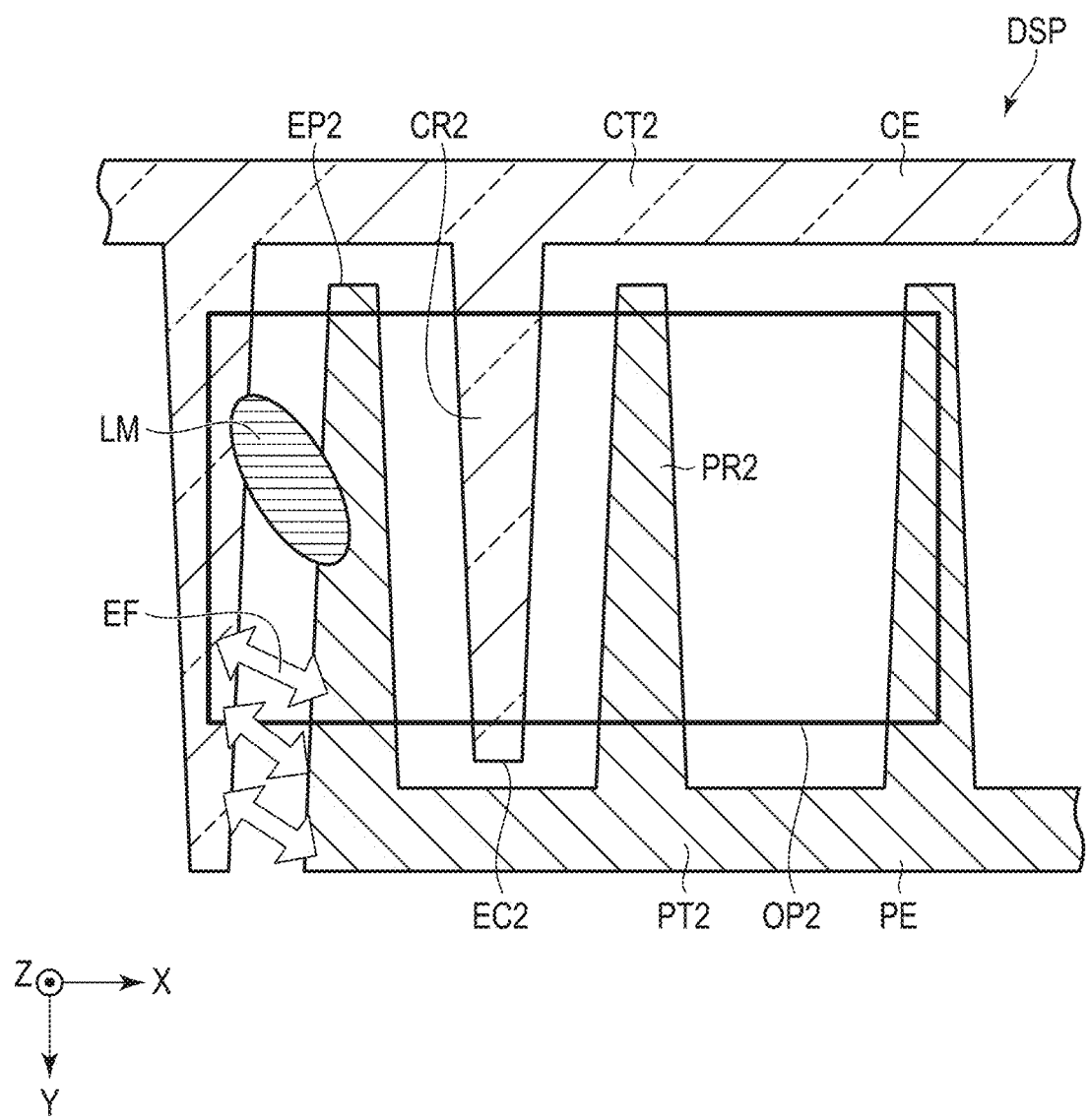
FIG. 8 is a plan view schematically showing an example of the configuration of the display device of the embodiment.

In order to increase the stability of the alignment of the liquid crystal molecules LM, the length of the branch portion CR2 is extended and the end portion EC2 is placed adjacent to the end portion EPT2, which is a part of the oblique side LP2. FIG. 8 is a plan view schematically showing an example of the configuration of the display device of the embodiment. In the configuration shown in FIG. 8, the oblique side LC2 is provided adjacent to the end portion EPT2. The distance between the end portion EPT2 and the oblique side LC2 is approximately the same as the distance between the oblique side LC2 and the oblique side LP2, for example. As a result, the electric field EF generated between the end portion EPT2 and the oblique edge LC2 is equal to that of the other part. Therefore, the stability of the alignment of the liquid crystal molecules LM shown in FIG. 8 is improved.

Figure 9:
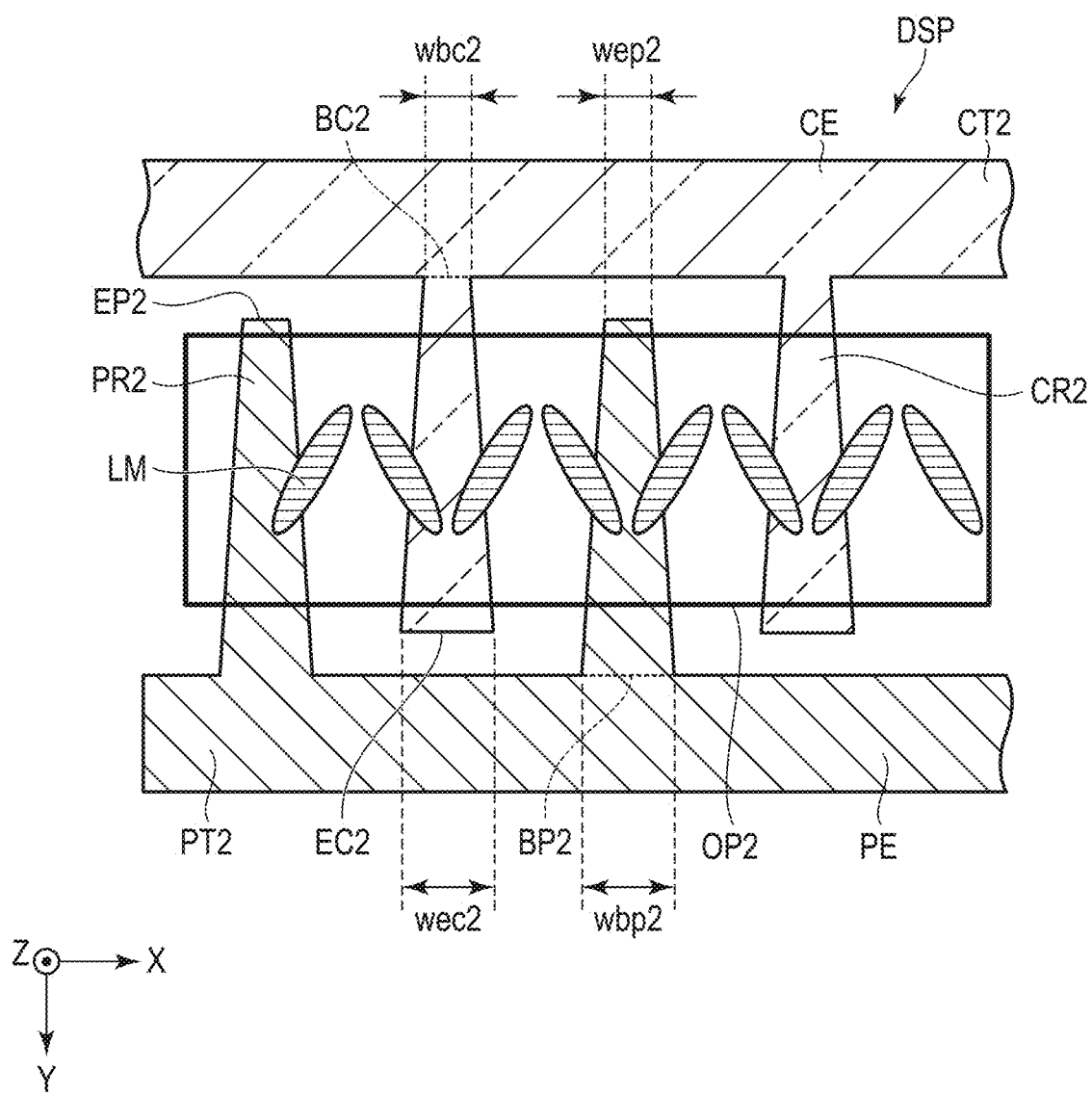
FIG. 9 is a plan view showing a configuration example of the display device in the embodiment.

FIG. 9 is a plan view showing another configuration example of the display device in the embodiment. The configuration example illustrated in FIG. 9 differs from the configuration example of FIG. 6 in that the branch portion CR of the common electrode CE is in a reverse-tapered shape.

In the branch portion PR2 shown in FIG. 9, the length (width) of the base portion BP2 along the first direction X is set to a width wbp2 and the length (width) of the end portion EP2 along the first direction X is set to a width wep2. In the branch portion CR2, the length (width) of the base portion BC2 along the first direction X is set to a width wbc2 and the length (width) of the end portion EC2 along the first direction X is set to a width wec2.

The width wbp2 is greater than the width wep2. That is, the branch portion PR2 becomes smaller in width as it extends in the opposite direction to the second direction Y. Note that the branch portion PR2 has a tapered shape.

On the other hand, the width WBC2 is less than the width WEC2. That is, the branch portion CR2 becomes larger in width as it extends in the second direction Y. The branch portions CR2 has a reverse-tapered shape which increases its width towards its tip.

Note that FIG. 9 shows an example in which the branch portion CR of the common electrode CE has a reverse-tapered shape, but the embodiment is not limited to this configuration. In place of the branch portion CR, the branch portion PR of the pixel electrode PE may have a reverse-tapered shape. Here, it suffices if one of the branch portions PR and CR has a tapered shape and the other has a reverse-tapered shape.

Figure 10:
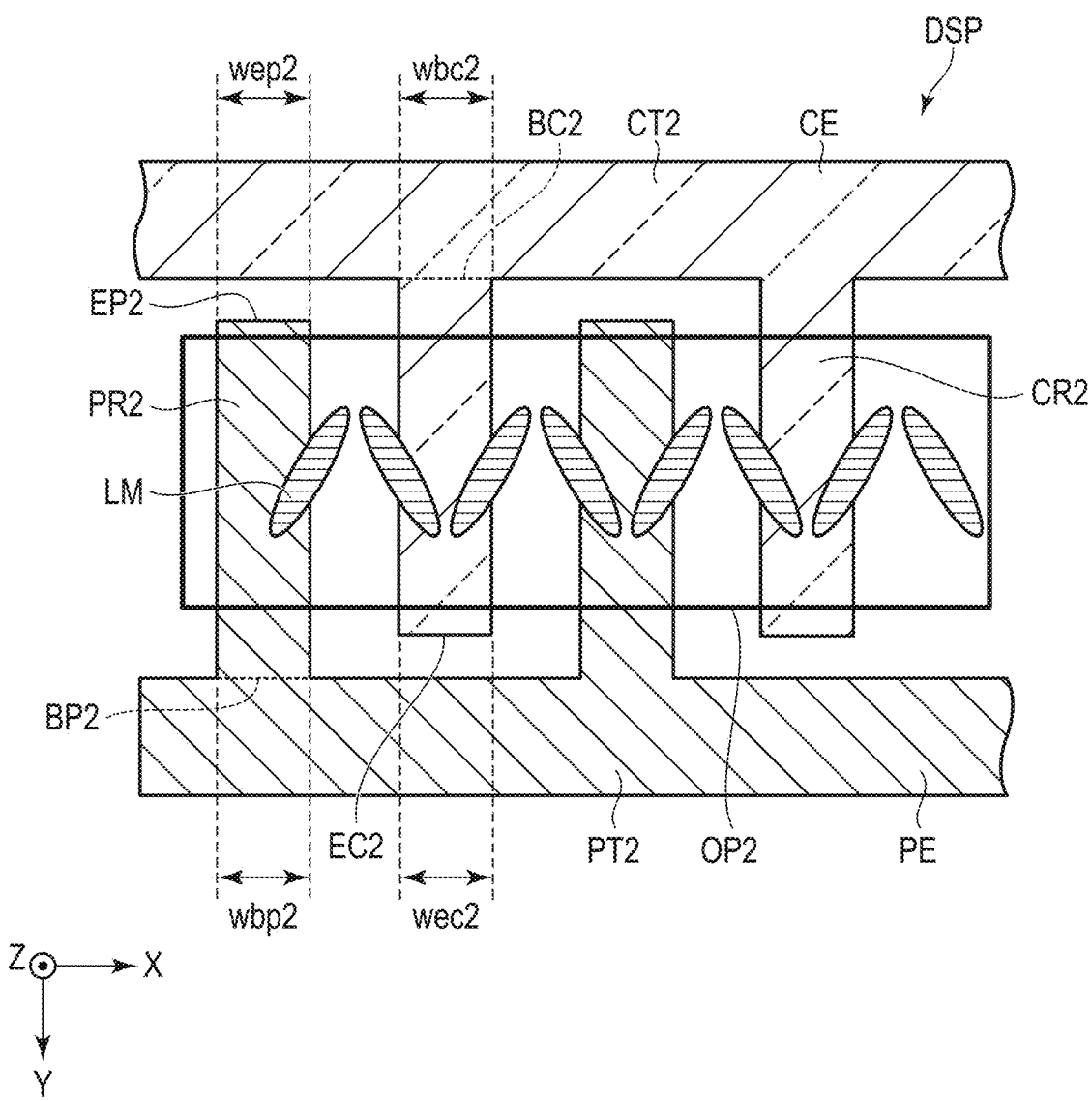
FIG. 10 is a plan view showing a configuration example of the display device in the embodiment.

FIG. 10 is a plan view of another configuration example of the display device in the embodiment. The configuration example illustrated in FIG. 10 is different from the configuration example illustrated in FIG. 6 in that the branch portion CR of the common electrode CE and the branch portions PR of the pixel electrode PE have a constant width.

In FIG. 10 as well, a width wbp2, a width wep2, a width wbc2 and a width wec2 are defined as so in FIG. 9.

The width wbp2 is equal to the width wep2. In other words, the branch portions PR2 have a constant width even when extended in the opposite direction to the second direction Y. The branch portions PR2 have a rectangular shape.

The width wbc2 is equal to the width wec2. In other words, the branch portions CR2 have a constant width even when extended in the second direction Y. The branch portions CR2 have a rectangular shape.

Note that the arrangements and shapes of the pixel electrodes PE and the common electrodes CE around the aperture OP2 have been described with reference to from FIG. 6 to FIG. 10, but the embodiment is not limited to these configurations. The arrangements and shapes of the pixel electrodes PE and the common electrodes CE around the aperture OP1 can be determined in the same manner based on the descriptions provided above. Note here that the arrangements and shapes of the pixel electrodes PE and the common electrodes CE around the aperture OP1 may be line symmetrical with those of the aperture OP2 with respect to the first direction X. In other words, the shapes and arrangements of the electrodes around the aperture OP1 may be inverted upside down with the shapes and arrangements of the electrodes around the aperture OP2.

According to the embodiment, it is possible to reduce the number of processing steps which use a photomask. As a result, the reduction in the number of manufacturing steps and further the improvement in reliability can be achieved.

Configuration Example 1

Figure 11:
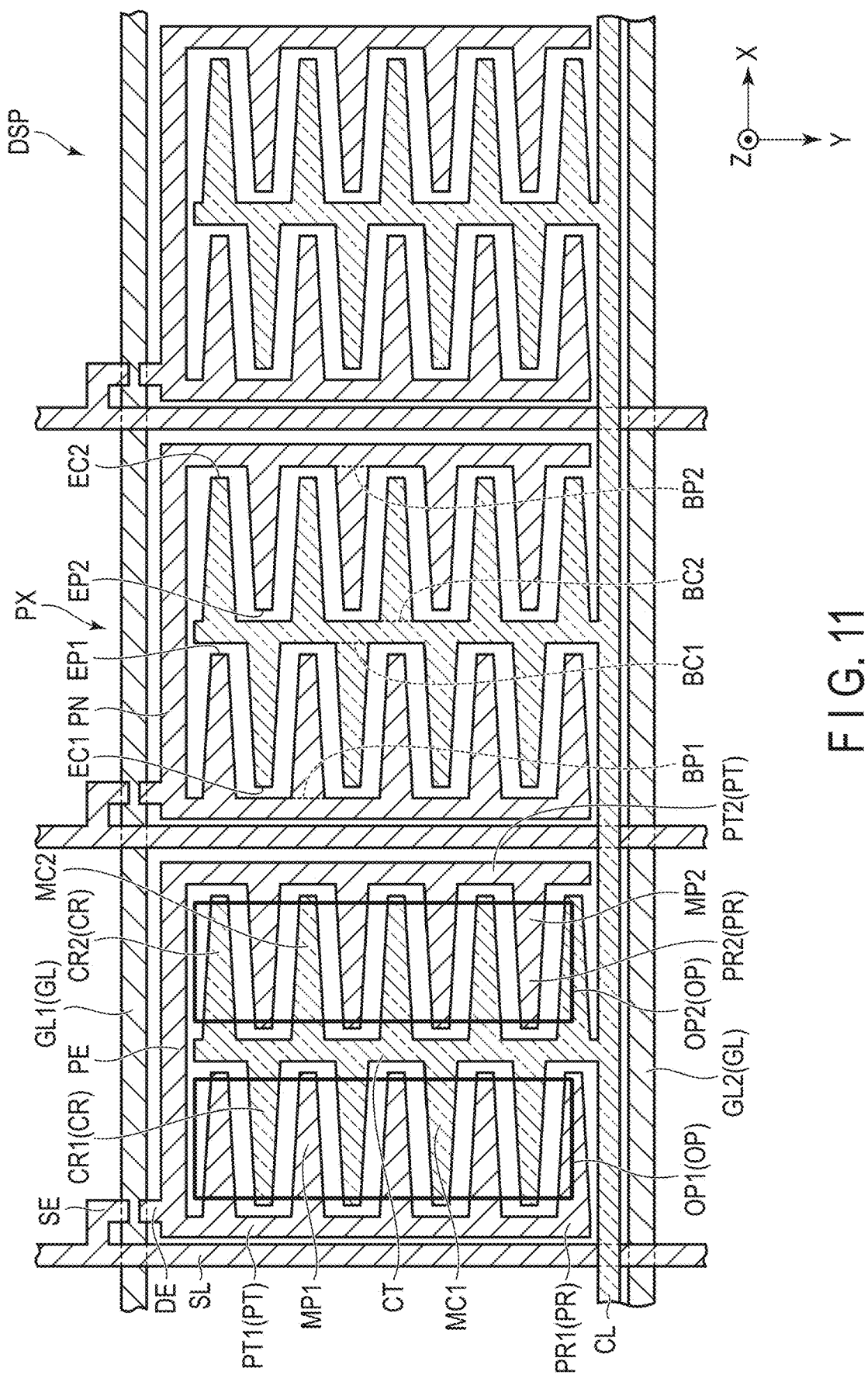
FIG. 11 is a plan view showing a configuration example of the display device in the embodiment.

FIG. 11 is a plan view of another configuration example of the display device in the embodiment. The configuration example illustrated in FIG. 11 is different from the configuration example illustrated in FIG. 5 in that the branches are extended along the first direction X.

The scanning lines GL1 and GL2, the signal lines SL, and the source electrodes SE are similar to those shown in FIG. 5, and therefore the explanations thereof will be omitted here, but instead refer to the explanations provided before with reference to FIG. 5.

The pixel electrode PE includes a trunk portion PT1 and a trunk portion PT2 extending along the second direction Y, a plurality of branch portions PR1 extending from the trunk portion PT1 along the first direction X, and a plurality of branch portions PR2 extending from the trunk portion PT2 along a direction opposite to the direction X. The branch portion PR1 and the branch portion PR2 which are closest to the scanning line GL1 are connected to each other to constitute a connection wiring line PN.

Adjacent to the scanning line GL2, a common wiring line CL is provided. The common wiring line CL extends over multiple pixels PX along the first direction X. For each pixel PX, trunk portions CT extend from the common wiring line CL in a direction opposite to the second direction Y. A plurality of branch portions CR1 extend from the trunk portion CT along a direction opposite to the first direction X. A plurality of branch portions CR2 extend from the trunk portion CT along the first direction X. The branch portions CR1 and the branch portions PR1 are arranged alternately in line with each other along the second direction Y. The branch portions CR2 and the branch portions PR2 are arranged alternately in line with each other along the second direction Y.

As in the case of FIG. 5, the distal end of the branch portions PR1 is defined as an end portion EP1, and the boundary between trunk portion PT1 and the branch portions PR1 is defined as a base portion BP1. The distal end of the branch portions PR2 is defined as an end portion EP2, and the boundary between the trunk portion PT2 and the branch portion PR2 is defined as a base portion BP2. The distal end of the branch portion CR1 is defined as an end portion EC1, and the boundary between the trunk portion CT and the branch portion CR1 is defined as a base portion BC1. The distal end of the branch portion CR2 is defined as an end portion EC2, and the boundary between the trunk portion CT and the branch portion CR2 is defined as a base portion BC2.

A light-shielding layer is provided between the scanning line GL1 and the scanning line GL2, and in the region surrounded by the trunk portion PT1 and the trunk portion CT except for the aperture OP1. Further, a light-shielding layer is provided between the scanning line GL1 and the scanning line GL2, and in the region surrounded by the trunk portion PT2 and the trunk portion CT except for the aperture OP2. The regions covered by the light-shielding layers do not transmit light, and only the apertures OP1 and OP2 allow light to pass through.

The aperture OP1 overlaps a region MP1 of the branch portion PR1, which excludes the region near the end portion EP1 and the region near the base portion BP1, and a region MC1 of the branch portion CR1, which excludes the region near the end portion EC1 and the region near the base portion BC1.

The aperture OP2 overlaps a region MP2 of the branch portion PR2, which excludes the region near the end portion EP2 and the region near the base portion BP2, and a region MC2 of the branch portion CR2, which excludes the region near the end portion EC2 and the region near the base portion BC2.

The end portion EP1 of the branch portion PR1, the end portion EP2 of the branch portion PR2, the end portion EC1 of the branch portion CR1 and the end portion EC2 of the branch portion CR2 are covered by the light-shielding layer.

A part of the branch portion BR closest to the common wiring line CL and a part of the branch portion CR closest to the common wiring line CL as well are covered by the light-shielding layer.

As shown in FIG. 11, in the configuration in which where the branch portions BR and the branch portions CR extend along a direction parallel to the first direction X as well, the number of processing step using a photomask can be reduced as in the case of FIG. 5. Therefore, the number of manufacturing steps can be reduced and the reliability can be improved.

Figure 12:
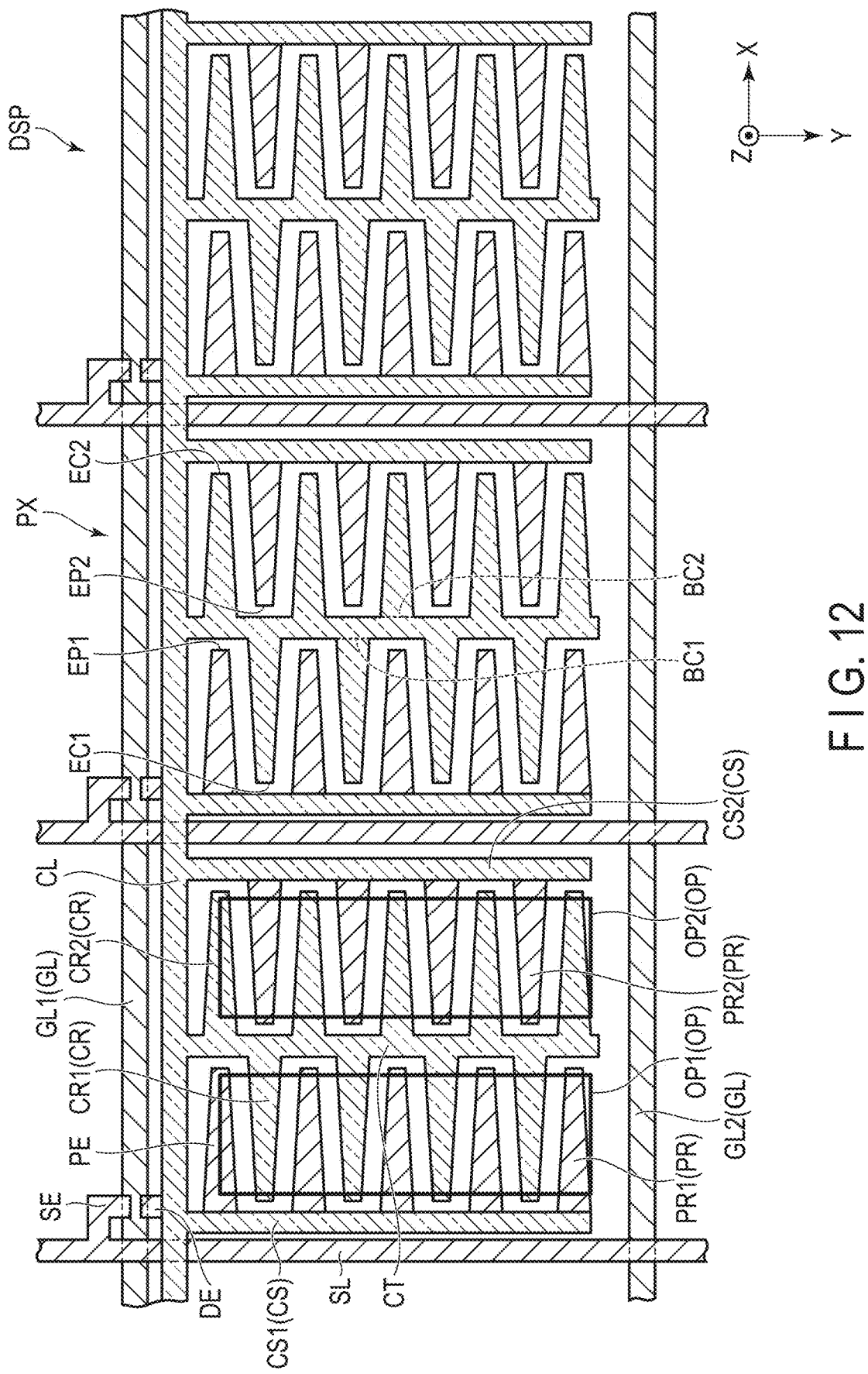
FIG. 12 is a plan view showing a configuration example of the display device in the embodiment.

FIG. 12 is a plan view of still another configuration example of the display device in the embodiment. The configuration example illustrated in FIG. 12 is different from the configuration example illustrated in FIG. 11 in that a part of the common electrode CE and a part of the pixel electrode PE overlap each other in plan view.

Figure 13:
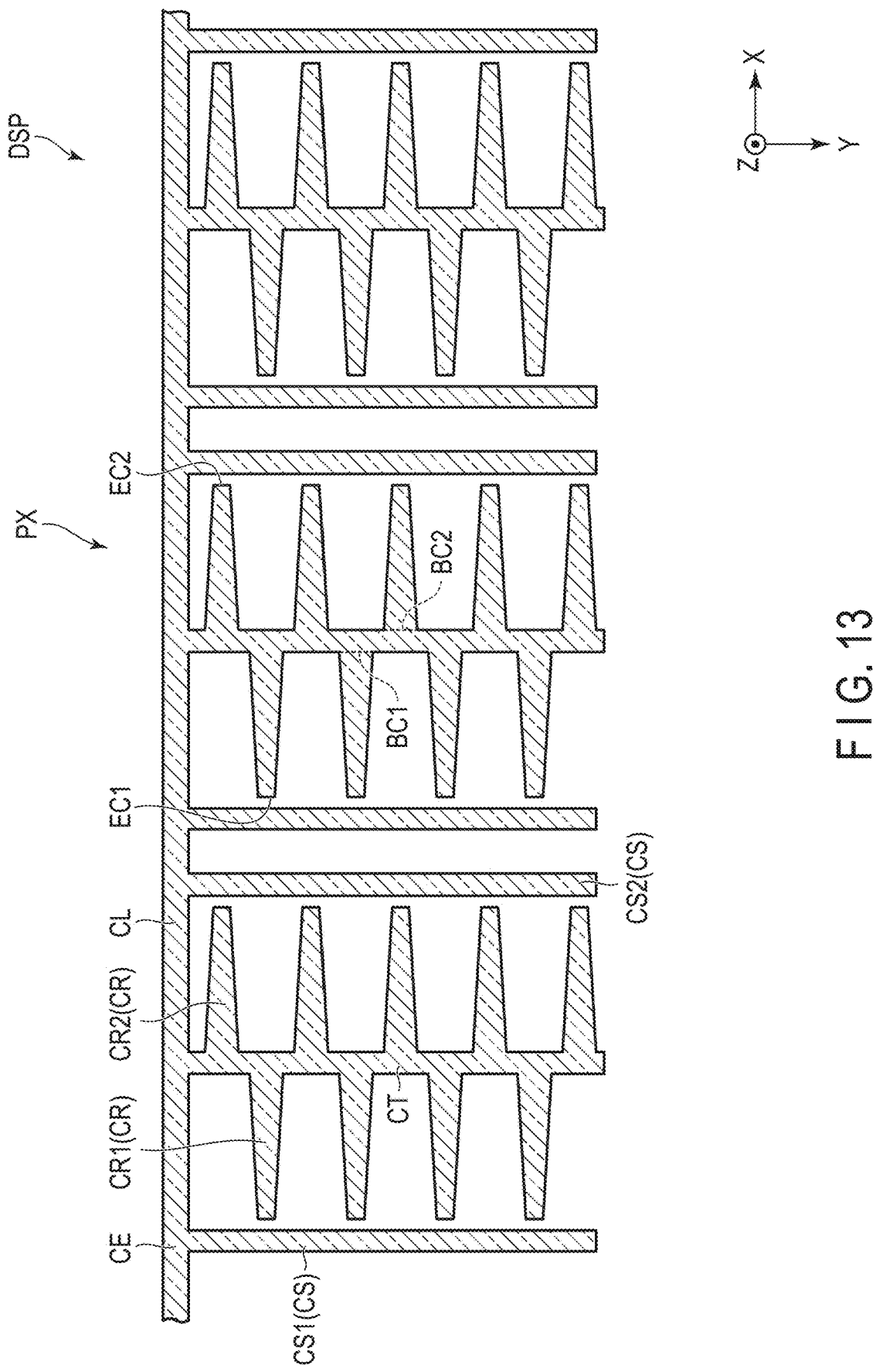
FIG. 13 is a plan view showing a common electrode among the components of the display device shown in FIG. 12.
Figure 14:
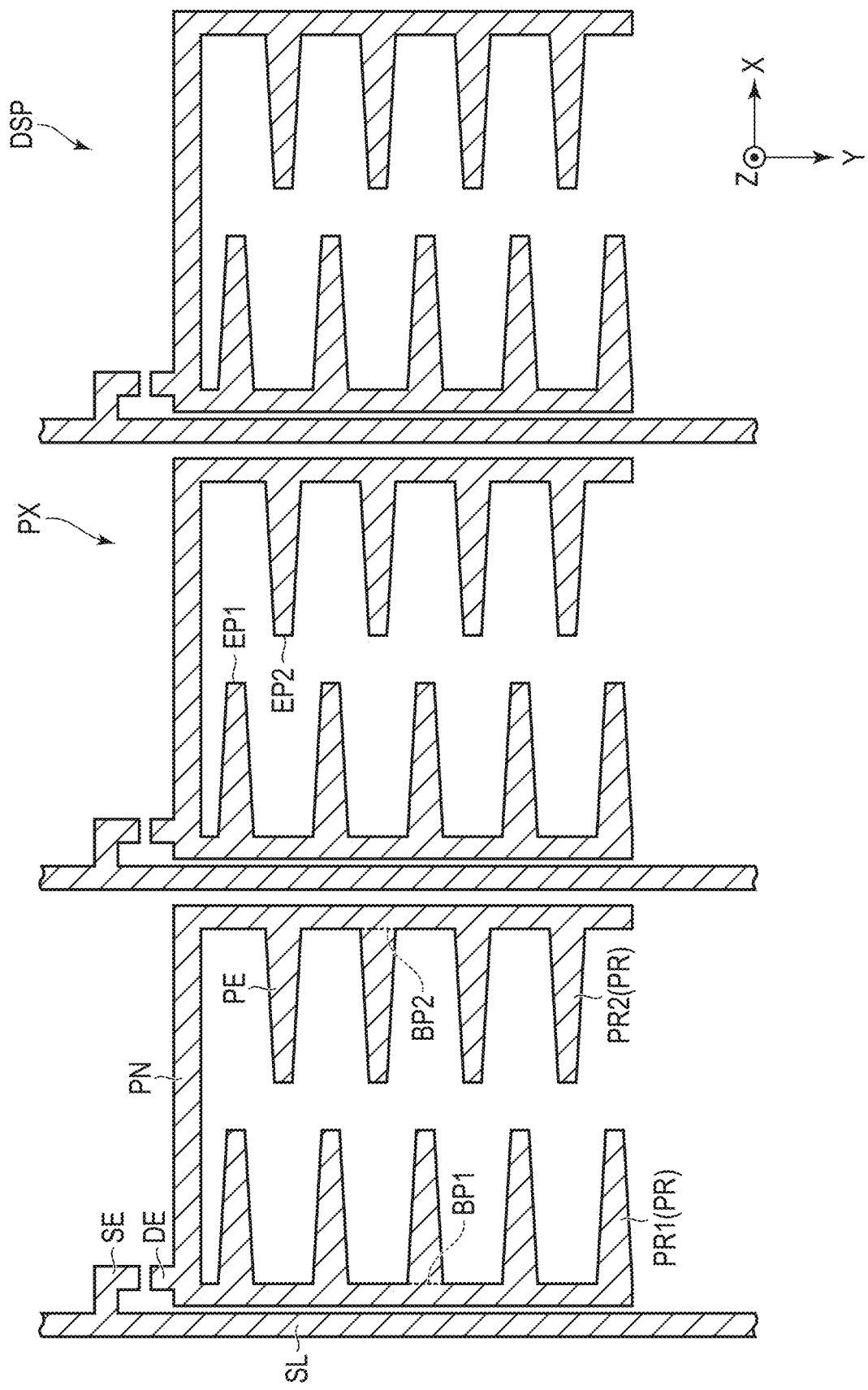
FIG. 14 is a plan view showing a signal line, drain electrode and pixel electrode among the components of the display device shown in FIG. 12.

FIG. 13 is a plan view of the common electrode CE among the components of the display device shown in FIG. 12. FIG. 14 is a plan view of the signal lines SL, drain electrodes DE and pixel electrodes PE among the components of the display device shown in FIG. 12.

In FIG. 12 as well, the scanning lines GL1 and GL2, the signal lines SL, and the source electrodes SE are similar to those shown in FIG. 5, and therefore the explanations thereof will be omitted here, but instead refer to the explanations provided before with reference to FIG. 5.

The pixel electrode PE includes a trunk portion PT1 and a trunk portion PT2 extending along the second direction Y, a plurality of branch portions PR1 extending from the trunk portion PT1 along the first direction X, and a plurality of branch portions PR2 extending from the trunk portion PT2 along a direction opposite to the direction X. The branch portion BR1 and the branch portion BR2 closest to the scanning line GL1 are connected to each other to constitute a connection wiring line PN.

The trunk portion PT1 is provided adjacent to the signal line SL. The trunk portion PT2 is provided adjacent to the signal lines SL of adjacent pixels PX.

In FIG. 12, a common wiring line CL is provided adjacent to the scanning line GL1 and to overlap the connection wiring line PN. The common wiring line CL extends over multiple pixels PX along the first direction X. For each pixel PX, a trunk portion CT extends from the common wiring line CL in a direction opposite to the second direction Y. A plurality of branch portions CR1 extend from the trunk portion CT along a direction opposite to the first direction X. A plurality of branch portions CR2 extend from the trunk portion CT along the first direction X. The branch portions CR1 and the branch portions PR1 are arranged alternately in line with each other along the second direction Y. The branch portions CR2 and the branch portions PR2 are arranged alternately in line with each other along the second direction Y.

From the common wiring line CL, a protrusion CS1 is protruded out to be adjacent to the signal line SL and overlap the trunk portion PT1. From the common wiring line CL, a protrusion CS2 is protruded out to be adjacent to the signal line SL of the adjacent pixel PX and overlap the trunk portion PT2. The protrusion CS1 and the projection CS2 extend in a direction opposite to the second direction Y. When there is no need to particularly distinguish between the protrusion CS1 and the protrusion CS2, they are referred to as protrusions CS.

In the display device DSP shown in FIG. 12, a storage capacitance can be formed in the region where the pixel electrode PE and the common electrode CE overlap each other, that is, the region where the connection wiring line PN and the common wiring line CL overlap each other, the region where the trunk portion PT1 and the protruding portion CS1 overlap each other, and the region where the trunk portion PT2 and the protruding portion CS2 overlap each other.

In this configuration example as well, advantageous effects similar to those of the embodiment can be exhibited.

In this disclosure, the branch portions PR and the branch portions CR are referred to as the first branches and the second branches, respectively. The trunk portion PT and the trunk portion CT are referred to as the first trunk and the second trunk, respectively. The base portions BP and the base portions BC are referred to as the first base portions and the second base portions, respectively. The end portions EP and the end portions EC are referred to as the first end portions (or the first edges) and the second end portions (the second edges), respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a plurality of scanning lines extending along a first direction;
   a plurality of signal lines extending along a second direction intersecting the first direction;
   a plurality of pixels provided at respective intersections of the plurality of scanning lines and the plurality of signal lines;
   a pixel electrode provided in each of the plurality of pixels and formed in a same layer as that of the signal lines; and
   a common electrode provided over the plurality of pixels, wherein
   the pixel electrode includes a first trunk portion and a plurality of first branch portions extending from the first trunk portion,
   the common electrode includes a second trunk portion and a plurality of second branch portions extending from the second trunk portion,
   the plurality of first branch portions and the plurality of second branch portions are arranged alternately in line with each other,
   the signal lines and the pixel electrodes are formed of a same material and by a same process,
   when a boundary between the first branch portion and the first trunk portion is a first base portion, and a boundary between the second branch portion and the first trunk portion is a second base portion,
   a first distal end of each of the first branch portion and the first trunk portion, and a second distal end of each of the second branch portion and the second base portion are covered by a light-shielding layer,
   a part of the pixel electrode and a part of the common electrode overlap each other to form a storage capacitance,
   the pixel electrode comprises a connection wiring line that connects two of the first branch portions, the common electrode comprises a common wiring line, the second trunk portion, the second branch portion and a protrusion protruding from the common wiring line, the first trunk portion and the protruding portion of the pixel electrode, and the connection wiring line and the common wiring line overlap each other to form the storage capacitance, and the light shielding layer overlaps the first trunk portion and the protruding portion of the common electrode, and the connection wiring line and the common wiring line to form the storage capacitance.

2. The display device according to claim 1, wherein the first trunk portion and the second trunk portion extend along the second direction, and the plurality of first branch portions and the plurality of second branch portions extend along the first direction.

3. The display device according to claim 1, wherein the first trunk portion and the second trunk portion extend along the first direction, and the plurality of first branch portions and the plurality of second branch portions extend along the second direction.

4. The display device according to claim 1, wherein each of the plurality of first branch portions and each of the plurality of second branch portions have a tapered shape narrowing towards its distal end.

5. The display device according to claim 1, wherein one of each of the plurality of first branch portions and each of the plurality of second branch portions has a tapered shape and the other has a reverse-tapered shape.

6. The display device according to claim 1, wherein each of the plurality of first branch portions and each of the plurality of second branch portions have a rectangular shape.

* * * * *